US010386269B2

(12) United States Patent
Ishii et al.

(10) Patent No.: US 10,386,269 B2
(45) Date of Patent: Aug. 20, 2019

(54) ELECTRIC-VEHICLE TESTING DEVICE AND METHOD

(71) Applicant: KABUSHIKI KAISHA TOSHIBA, Tokyo (JP)

(72) Inventors: Ena Ishii, Kanagawa (JP); Hideki Ito, Kanagawa (JP); Tadatoshi Ishii, Tokyo (JP); Ken Ishii, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 175 days.

(21) Appl. No.: 15/456,198

(22) Filed: Mar. 10, 2017

(65) Prior Publication Data

US 2017/0212013 A1 Jul. 27, 2017

Related U.S. Application Data

(63) Continuation of application No. PCT/JP2015/079682, filed on Oct. 21, 2015.

(30) Foreign Application Priority Data

Oct. 31, 2014 (JP) ................................ 2014-223654

(51) Int. Cl.
*G01M 17/007* (2006.01)
*G01L 5/22* (2006.01)
(Continued)

(52) U.S. Cl.
CPC ............ *G01M 17/007* (2013.01); *B60L 3/12* (2013.01); *B60L 7/18* (2013.01); *B60L 7/26* (2013.01);
(Continued)

(58) Field of Classification Search
CPC ........... G01M 17/007; G01M 17/0074; G01M 13/025; G01L 5/225
See application file for complete search history.

(56) References Cited

U.S. PATENT DOCUMENTS 4,680,959 A * 7/1987 Henry ................. G01M 15/044
703/8
5,060,176 A * 10/1991 Nawa .................. G01M 13/025
701/51
(Continued)

FOREIGN PATENT DOCUMENTS

EP 0 731 361 A2 9/1996
JP 8-248104 9/1996
(Continued)

OTHER PUBLICATIONS

P. Fajri, V. Prabhala, N. Lofti, M. Ferdowsi and P. Shamsi, "Emulating Electric Vehicle Regenerative and Friction Braking Effect Using a Hardware-in-the-Loop (HIL) Motor/Dynamometer Test Bench," IECON 2014, Dallas, TX, pp. 2997-3003, Nov. 2014 (Year: 2014).*

(Continued)

*Primary Examiner* — Peter D Nolan
(74) *Attorney, Agent, or Firm* — Finnegan, Henderson, Farabow, Garrett & Dunner, L.L.P.

(57) ABSTRACT

According to one embodiment, an electric-vehicle testing apparatus includes processing circuitry. The circuitry generates a first signal corresponding to accelerator operation amount and a second signal corresponding to brake operation amount in accordance with test conditions. The circuitry controls torque of a test motor included in a test object. The circuitry computes running resistance to be assumed using a rotation speed of the test motor. The circuitry computes braking force using the second signal and an actual vehicle speed obtained from the rotation speed of the test motor. The circuitry controls torque of a load motor coupled to the test motor, based on a second command value corresponding to the running resistance and the braking force.

18 Claims, 10 Drawing Sheets

(51) Int. Cl.
*G01P 3/00* (2006.01)
*B60L 3/12* (2006.01)
*B60L 7/18* (2006.01)
*B60L 7/26* (2006.01)
*G01M 13/025* (2019.01)
*G01R 31/34* (2006.01)

(52) U.S. Cl.
CPC .......... *G01L 5/225* (2013.01); *G01M 13/025* (2013.01); *G01P 3/00* (2013.01); *B60L 2200/12* (2013.01); *B60L 2240/12* (2013.01); *B60L 2240/421* (2013.01); *B60L 2240/423* (2013.01); *B60L 2240/642* (2013.01); *B60L 2250/26* (2013.01); *G01R 31/343* (2013.01); *Y02T 10/642* (2013.01); *Y02T 10/7291* (2013.01); *Y02T 90/16* (2013.01)

(56) References Cited

U.S. PATENT DOCUMENTS

| | | | | |
|---|---|---|---|---|
| 5,430,645 | A * | 7/1995 | Keller | G01M 17/0074 324/160 |
| 5,623,104 | A * | 4/1997 | Suga | G01R 31/343 73/116.05 |
| 5,986,545 | A * | 11/1999 | Sanada | G01M 17/00 340/407.1 |
| 7,668,706 | B2 * | 2/2010 | Schoeggl | G01M 17/007 703/8 |
| 7,680,639 | B2 * | 3/2010 | Schoeggl | G01M 17/007 434/66 |
| 7,770,440 | B2 * | 8/2010 | Langthaler | G01M 13/025 73/114.15 |
| 8,868,280 | B2 * | 10/2014 | Uratani | G01M 15/10 701/29.1 |
| 9,360,395 | B2 * | 6/2016 | Engstrom | G01M 17/007 |
| 9,448,137 | B2 * | 9/2016 | Yoshimoto | G01M 17/007 |
| 9,893,673 | B2 * | 2/2018 | Engstrom | G01M 17/0074 |
| 2006/0288764 | A1 * | 12/2006 | Langthaler | G01M 13/025 73/114.15 |
| 2007/0179696 | A1 * | 8/2007 | Schoeggl | G01M 17/007 701/69 |
| 2009/0242293 | A1 * | 10/2009 | Tanaka | B60W 20/50 180/65.285 |
| 2014/0297098 | A1 * | 10/2014 | Yoshimoto | G01M 17/007 701/31.4 |
| 2015/0039178 | A1 | 2/2015 | Ishii et al. | |
| 2015/0377970 | A1 * | 12/2015 | Takei | B60W 10/08 318/490 |
| 2016/0062434 | A1 * | 3/2016 | Shiina | G06F 11/3648 713/310 |
| 2016/0171133 | A1 * | 6/2016 | Pfister | G01M 15/02 703/8 |
| 2016/0308484 | A1 * | 10/2016 | Engstrom | G01M 17/0074 |
| 2017/0059451 | A1 * | 3/2017 | He | G01M 17/013 |
| 2017/0176293 | A1 * | 6/2017 | Engstrom | G01M 17/007 |
| 2017/0191903 | A1 * | 7/2017 | Komada | H02K 15/02 |

FOREIGN PATENT DOCUMENTS

| | | |
|---|---|---|
| JP | 2001-91410 | 4/2001 |
| JP | 2004-12340 | 1/2004 |
| JP | 2005-274323 | 10/2005 |
| JP | 2005-351649 | 12/2005 |
| JP | 2010-110108 | 5/2010 |
| JP | 4742827 | 8/2011 |
| JP | 2011-257205 | 12/2011 |
| JP | 2015-30327 | 2/2015 |

OTHER PUBLICATIONS

English language International Search Report from the Japanese Patent Office, dated Dec. 15, 2015, for International Application No. PCT/JP2015/079682.

International Preliminary Report on Patentability dated May 2, 2017, issued by the International Bureau of WIPO in International Application No. PCT/JP2015/079662; 1 page.

Written Opinion of the International Searching Authority dated Dec. 15, 2016, issued by the International Bureau of WIPO in International Application No. PCT/JP2015/079682; 5 pages.

Wikipedia, "Rolling resistance," http://en.wikipedia.org/w/index.php?title=Rolling_resistance&oldid=620139239, 11 pages (Aug. 6, 2014).

* cited by examiner

1001 — Battery total amount: kWh
1002 — Total running distance: km
1003 — Power consumption rate: △△km/kWh

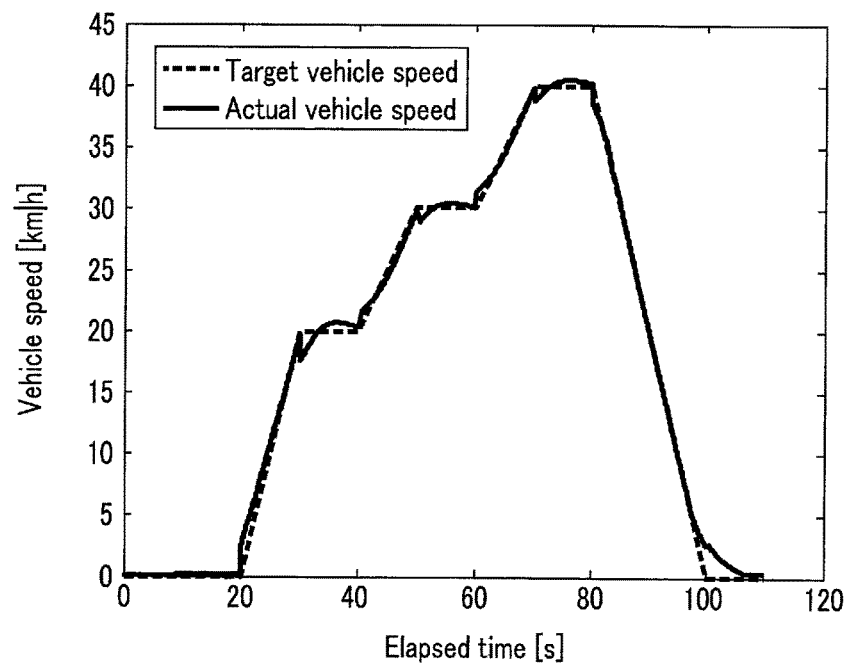
F I G. 11
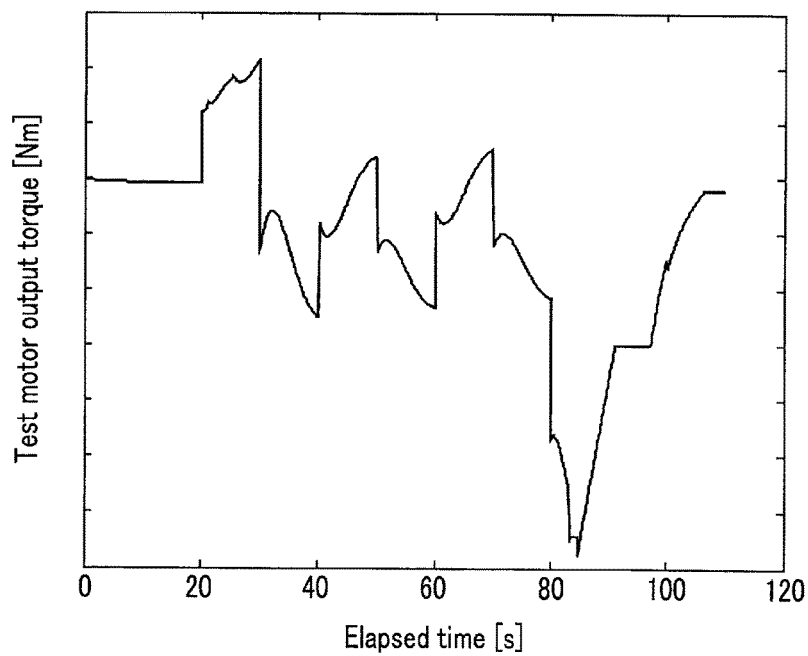
F I G. 12

ELECTRIC-VEHICLE TESTING DEVICE AND METHOD

CROSS-REFERENCE TO RELATED APPLICATIONS

This application is a Continuation Application of PCT Application No. PCT/JP2015/0762, filed Oct. 21, 2015 and based upon and claiming the benefit of priority from Japanese Patent Application No. 2014-223654, filed Sep. Oct. 31, 2014, the entire contents of which are incorporated herein by reference.

FIELD

Embodiments described herein relate generally to an electric-vehicle testing device and method.

BACKGROUND

In verification of an electric-vehicle drive unit including a motor, a battery, and a motor control ECU (engine control unit), a user wishes to ascertain how power consumption varies when the control algorithms of the motor control ECU and the parameters of a vehicle are changed. Generally, the verification needs a large-sized device because the evaluation is conducted on a chassis dynamometer by mounting the drive unit on the vehicle.

As a testing method for testing a motor mounted on an electric vehicle without using a chassis dynamometer, there is a testing method in which a motor is driven at the load of rotation speed and torque equivalent to the running of an electric vehicle by using a test device directly connected to a motor and a dynamometer and outputting from the dynamometer side torque corresponding to the running resistance according to the speed. As another testing method, there is a method for verifying a motor and an ECU by controlling the motor using the actual motor control ECU (hereinafter also referred to as an actual ECU).

BRIEF DESCRIPTION OF THE DRAWINGS

FIG. 11 is a graph showing time-series data of the comparison of the target vehicle speed pattern and the actual vehicle speed.
FIG. 12 is a graph showing time-series data of test motor output torque.

DETAILED DESCRIPTION

In the above-described testing method, the motor evaluation is achieved by controlling the speed of the motor without using the control algorithm of the motor control ECU. It is thus impossible to verify the influence of an electric drive system including the battery and motor upon overall efficiency.

Furthermore, in the other testing method described above, the signals that a user supplies from an operation panel are signals related to the accelerator, transmission shift, and brake. It is thus impossible to run a test that presupposes a pattern of change in the speed of a running vehicle.

In general, according to one embodiment, an electric-vehicle testing apparatus includes processing circuitry. The processing circuitry is configured to generate a first signal corresponding to accelerator operation amount by a driver and a second signal corresponding to brake operation amount by the driver in accordance with test conditions that include a target vehicle speed pattern indicating a variation in target vehicle speed along a time series. The processing circuitry is configured to control torque of test motor included in a test object based on a first command value corresponding to the first signal. The processing circuitry is configured to compute running resistance to be assumed when a vehicle runs using a rotation speed of the test motor. The processing circuitry is configured to compute braking force using the second signal and an actual vehicle speed obtained from the rotation speed of the test motor. The processing circuitry is configured to control torque of a load motor coupled to the test motor, based on a second command value corresponding to the running resistance and the braking force.

An electric-vehicle testing device and method according to the embodiments sill be described in detail with reference to the drawings. In the following embodiments, the elements with the same reference signs descriptions will be omitted as appropriate.

Furthermore, the following embodiments presuppose an evaluation test for a motor control ECU mounted on an electric vehicle, but they are not limited to this. The motor control ECU used in another electric automobile such as a motorcycle can be evaluated as well.

Figure 1:
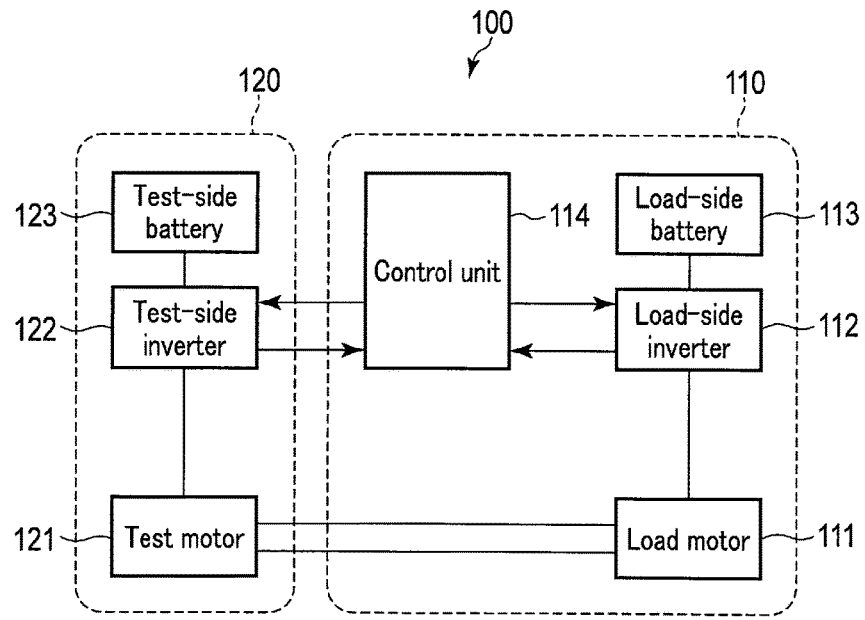
FIG. 1 is a block diagram showing an electric-vehicle testing system according to a first embodiment.

(First Embodiment)
An electric-vehicle testing system including an electric-vehicle testing device according to a first embodiment will be described with reference to the block diagram of FIG. 1.

The electric-vehicle testing system 100 according to the first embodiment includes an electric-vehicle testing device 110 and a test object 120.

The electric-vehicle testing device 110 includes a load motor 111, a load-side inverter 112, a load-side battery 113, and a on unit 114.

The test object 120 includes a test motor 121, a test-side inverter 122, and a test-side battery 123.

The load motor 111 is a motor to apply a load to the test motor 121, and it is so configured that the output shaft of the load motor 111 and that of the test motor 121 are coupled by a coupling or the like.

The load-side inverter 112 is connected to the load motor 111 and the load-side battery 113 to receive from the control unit 114 a load motor torque command value that is a value for setting torque of the load motor 111. The load-side inverter 112 controls an electric current based on the load motor torque command value to drive the load motor 111. As for the load-side inverter 112, its detailed configuration description will omitted because it may have a general configuration.

The load-side battery 113 is a rechargeable/dischargeable battery, and it is connected to the load-side inverter 112 to supply power to the load-side inverter 112. The load-side battery 113 may include a direct-current power supply device or a generator if it is configured to release regeneration current from the load-side inverter 112.

The test motor 121 is a motor to be tested and it is connected to the load motor 111 by coupling as described above.

The test-side inverter 122 is an inverter to be tested, and it is connected to the test motor 121 and the test-side battery 123 to receive from the control unit 114 test motor torque command value that is a value for setting torque of the test motor 121. The test-side inverter 122 controls current based on the test motor torque command value to drive the test motor 121. As for the test-side inverter 112, its detailed configuration description will be omitted because it may have a general configuration.

The test-side battery 123 is a vehicle-mounted battery to be tested, and it is connected to the test-side inverter 122 to supply power to the test-side inverter 122.

The control unit. 114 receives the rotation speed of the load motor 111 from the load-side inverter 112 to generate a load motor torque command value, and receives the rotation speed of the test motor 121 from the test-side inverter 122 to generate a test motor torque command value. The rotation speed of the load motor 111 and that of the test motor 121 are detected by a rotation speed detection element such as an encoder or a resolver, provided on the output shaft, and transferred to the control unit 114 via the test-side inverter 122 and the load-side inverter 112. The control unit 114 sends the load motor torque command value to the load-side inverter 112 to the load motor 111, and sends a test motor torque command value to the test-side inverter 122 to control the test motor 121. The control unit 114 will be described in detail later with reference to FIGS. 2 to 5.

The control unit 114 will be described in detail below with reference to the block diagram of FIG. 2.

The control unit 114 includes a driver signal generation unit 201, a torque control unit 202 (also referred to as a first torque control unit), a running resistance computation unit 203, a force computation unit 204, and a load-side torque control unit 205 (also referred to as a second torque control unit).

The driver signal generation unit 201 computes driver signal from a target vehicle speed pattern and the actual vehicle speed. The target vehicle speed pattern indicates a variation in target vehicle speed along the time series when it is assumed that the vehicle is running on a certain section of a road. The actual vehicle speed is a vehicle speed computed from the rotation speed of the test motor 121, the rotation speed of the load motor 111, or the average value of the rotation speed of the test motor 121 and the rotation speed of the load motor 111. Specifically, the actual vehicle speed can be computed using the equation (1).

$$\text{vehicle speed [m/s]} = \frac{\text{motor rotation speed } [rpm] \times 2\pi \times \text{tire radus [m]}}{60 \times \text{gear reduction ratio}} \quad (1)$$

The tire radius is the tire radius of assumed vehicle, and the gear reduction ratio is also the gear reduction ratio of an assumed vehicle. The tire radius and the gear reduction ratio may be those included in vehicle specifications.

Also, the actual vehicle speed can be computed by the driver signal generation unit 201 or in the previous stage of the diver signal generation unit 201, i.e. a stage between the driver signal generation unit 201 and the test side inverter 122. In the following it is assumed that the actual vehicle speed is computed in the previous stage.

The driver signal is a signal corresponding to the rivers operation and, in this embodiment, it is an accelerator operation signal referred to as a first signal) corresponding to the operation amount of the drivers accelerator pedal to drive the vehicle and a brake operation signal (referred to as a second signal) corresponding to the operation amount of the driver's brake pedal to brake the vehicle. In the case of assuming a vehicle with a transmission, a shift lever operation signal that presupposes a shift lever operation should also, be included in the driver signal.

The test-side torque control unit 202 stores the control algorithms of the motor control ECU to be tested, and receives an accelerator operation signal from the driver sign generation unit 201 to generate a test motor torque command value based on a table in which the correspondence between the accelerator operation signal and the vehicle speed is defined in advance. Thus, the torque of the test motor 121 can be controlled under the control of the actual ECU. Also, the source code of the drive motor control ECU can be implemented on software to achieve the test-side torque control unit 202 and the actual ECU can be incorporated as part of the test-side torque control unit 202.

The running resistance computation unit 203 computes running resistance to be assumed when the vehicle runs at the actual vehicle speed, using the actual vehicle speed. The running resistance includes at least ore of acceleration resistance (inertial resistance), aerodynamic resistance, rolling resistance, and grade resistance. Since the process of the running resistance computation unit is the same as the running resistance computation process in the driver signal generation unit 201, it will be described later with reference to FIG. 4.

The braking force computation unit 204 receives a brake operation signal from the driver signal generation unit 201 to compute the braking force of the vehicle on the basis of the actual vehicle speed and the brake operation signal. Details of the braking force computation unit 204 will be described later with reference to FIG. 5.

The load-side torque control unit 205 receives the running resistance from the running resistance computation unit 203, and receives the braking force from the braking force computation unit 204 to generate a load motor torque command value based on the running resistance and the braking force. By controlling the load motor ill in accordance with the load motor torque command value, a load such as the running resistance to the test motor 121 can be simulated.

Also, the test conditions for evaluating the actual ECU (target vehicle speed patterns, control algorithms for the motor control ECU, control parameters of the motor control ECU, vehicle specifications of an assumed vehicle, etc, are set in advance in the control unit 114.

The driver signal generation process of the driver signal generation unit 201 will be described below with reference to the flowchart of FIG. 3. The driver signal generation unit 201 performs the process in the flowchart shown in FIG. 3, for each computation period. The computation period can be set to a value between a few milliseconds and a few seconds.

In step 301, the running resistance is computed based on the target vehicle speed. The computation process of the running resistance will be described later with reference to the flowchart of FIG. 4.

In step S302, the torque required for reaching the target speed is computed. The required torque is computed by multiplying the running resistance computed in step S301 by the tire radius of the assumed vehicle and dividing it by the reduction ratio of the reduction gear of the assumed vehicle. The computed required torque becomes driving torque if its value is positive, and it becomes braking torque if its value is negative. The computed required torque can be divided further by the efficiency of the reduction gear.

In step S303, it is determined whether the required torque is positive or not. The process proceeds to step S306 if the required torque is positive, and it proceeds to step S304 when the required torque is negative.

In step S304, it is determined whether a value obtained by subtracting the maximum regenerative braking torque (negative value) from the required torque is negative or not.

In electric vehicles (EV), there is a braking force of the combination of a regenerative braking force generated from the drive motor (test motor) and a braking force generated by a mechanical brake such as a disc brake. If the electric vehicles have no cooperative regenerative mechanism, the regenerative braking force corresponds to an accelerator pedal operation, and the braking force generated by a mechanical brake corresponds to a brake pedal operation. It is thus understood that if the required torque has a negative value even though the maximum regenerative braking torque at the current vehicle speed is subtracted from the required torque, the required torque is braking torque that needs to be generated by a mechanical brake. The relationship between the vehicle speed and the maximum regenerative braking torque can be determined by a method, such as referring to a predefined look-up table.

If the value obtained by subtracting the maximum regenerative braking torque from the required torque is negative, the process proceeds to step S305. If the value is not negative, or is zero or larger, the process proceeds to step S306.

In step S305, a brake operation signal is computed be the maximum regenerative braking torque by the accelerator operation lacks a braking force. As the brake operation signal, for example, an operation amount of the brake pedal corresponding to the brake torque computed in step S304 can be computed by referring to a look-up table for obtaining the operation ent of the brake pedal using a predefined braking torque as an index.

In step S306, an accelerator operation signal is computed. As the accelerator operation signal, for example, an operation amount of the accelerator pedal corresponding to the drive torque can be computed by referring to a look-up table for obtaining the operation amount of the accelerator pedal using a predefined driving torque and vehicle speed as an index.

In step S307, a speed deviation between the target vehicle speed and the actual vehicle speed is computed.

In step 308, an integrated value of the speed deviation between the target vehicle speed and the actual vehicle speed is updated.

In step S309, the accelerator operation signal corrected. For example, the accelerator operation signal is corrected by adding to the accelerator operation signal the sum of a value obtained by multiplying the speed deviation computed in step S307 by a predetermined constant A, and a value obtained by multiplying the integrated value of the speed deviation computed in step 3308 by a predetermined constant B.

In step S310, the brake operation signal is corrected. For example, the brake operation signal is corrected by adding to the brake operation signal the sum of a value obtained by multiplying the speed deviation computed in step S307 by a predetermined constant C, and a value obtained by multiplying the integrated value of the speed deviation computed in step S308 by a predetermined constant D. This ends the driver signal generation process of the driver signal generation unit 201.

Figure 3:
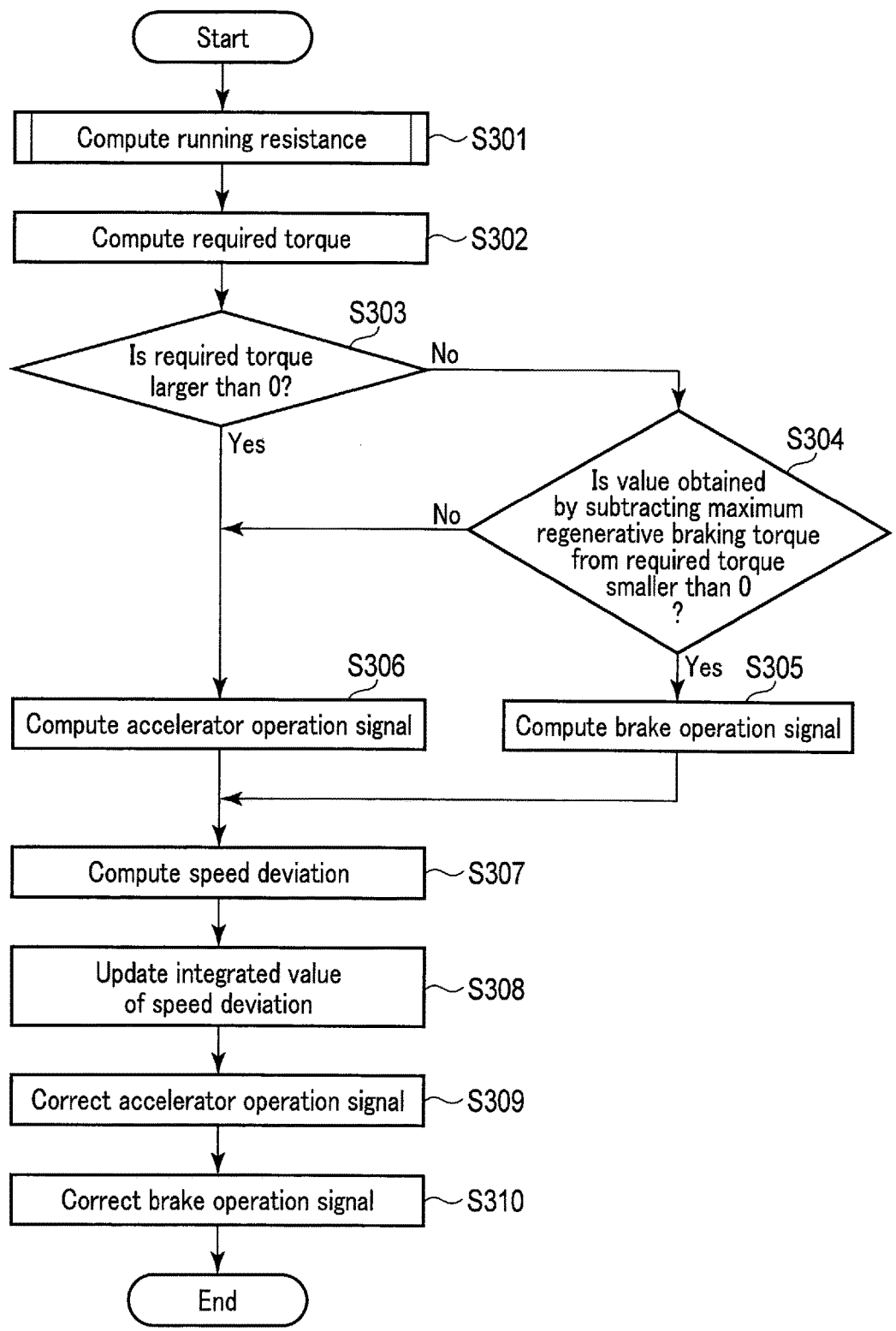
FIG. 3 is a flowchart showing a driver signal generation process of a driver signal generation unit.

Note that the process shown in FIG. 3 is one example of the process of the driver signal generation unit 201, and the process of steps S303 to S306 can be omitted and only the process of step S301 and steps S307 to S311 can be executed to compute the accelerator operation signal and the brake operation signal.

The running resistance computation process of step S301 will be described below with reference to the flowchart of FIG. 4. The computation period can be set to a value between a few milliseconds and a few seconds.

In step S401, a target acceleration is computed from the target vehicle speed the target vehicle speed pattern. The target acceleration can be computed from the target vehicle speed using a difference method and a numerical if method, such as a method of the combination of a difference method and a lowpass filter.

In step S402, acceleration resistance is computed. The acceleration resistance can be computed by multiplying the target acceleration by the vehicle weight of an assumed vehicle.

In step 3403, aerodynamic resistance is computed. The aerodynamic resistance can be computed from the target vehicle speed using equation (2)

$$\text{aerodynamic resistance force } [N] = \frac{\text{aerodynamic resistance coefficient} \times \text{frontal projected area } [m^2] \times \text{air density } [kg/m^3] \times \text{vehicle speed } [m/s]^2}{2} \quad (2)$$

In the above equation, the aerodynamic resistance coefficient and the frontal projected area are the aerodynamic resistance coefficient and frontal projection area of an assumed vehicle, and the vehicle speed is the target vehicle speed.

In step S404, rolling resistance is computed. The rolling resistance can be computed by multiplying together a rolling resistance coefficient, the assumed vehicle's vehicle weight, its gravity acceleration, and the cosine of the inclination angle of an assumed road surface.

In step S405, grade resistance is computed. The grade resistance can be computed by multiplying the vehicle weight by the gravity acceleration of the vehicle given by the vehicle specifications by the sine of the angle of the assumed road surface. The angle of the road surface assumed here has a preset value as a test condition, and the value may be a constant value or a value that varies with a lapse of time or the total running distance.

In step S406, the resistances computed in steps S402 to S405 are added and computed as running resistance.

This ends the running resistance computation process. In FIG. 4, the running resistance is obtained by adding all of the acceleration resistance, aerodynamic resistance, rolling resistance, and grade resistance computed in the respective steps, but one or some of the steps may be omitted, in other words, the resistance computed in at least one of steps 402 to 405 in FIG. 4 can be used as running resistance.

Figure 4:
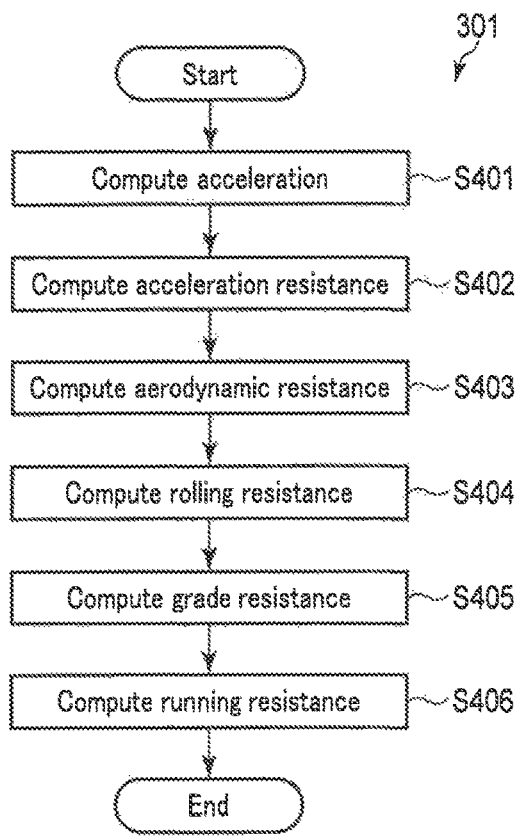
FIG. 4 is a flowchart showing a running resistance computation process.

Furthermore, the running resistance computation process in the running resistance computation unit 203 can be performed by computing the actual acceleration using the actual vehicle speed in place of the target vehicle speed in step 401 of FIG. 4 and computing the resistance in each of the steps after step S402 using the actual vehicle speed and the actual acceleration.

Figure 5:
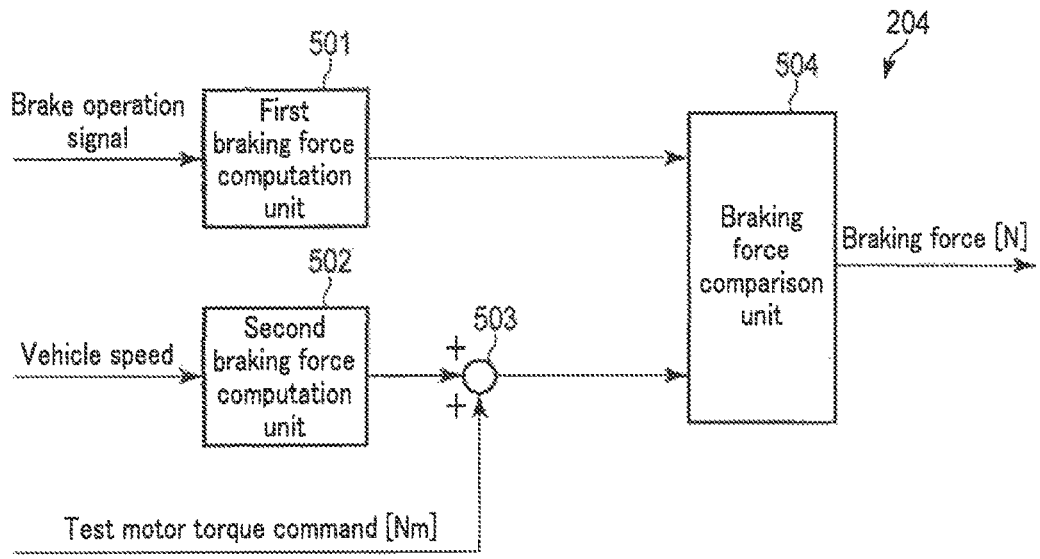
FIG. 5 is a block diagram showing the details of a braking force computation unit.

The braking force computation unit 204 will be described in detail below with reference to the block diagram of FIG. 5.

The braking force computation unit 204 includes a first braking force computation unit 501, a second braking force computation unit 502, an addition unit 503, and a braking force comparing unit 504.

The first braking force computation unit 501 receives brake operation signal from the driver signal generation unit 201 shown in FIG. 6 described later and refers to the relationship between the predefined brake pedal operation amount and braking force to compute a first braking force candidate from the brake operation signal.

The second braking force computation unit 502 refers to the relationship between the predefined actual vehicle speed and braking force shown in S scribed later to compute a second braking force candidate.

When the addition unit 503 has a function of outputting torque even if the accelerator operation amount is zero in the test-side torque control unit 202, namely, function of outputting creep torque, it adds a test motor torque command value corresponding to the creep torque from the test-side torque control unit 202 to the second braking force candidate from the second braking force computation unit 502.

The reasons for the above are as follows. If the vehicle speed is zero, the output of the second braking or computation unit 502 becomes zero, and since the creep torque is set, the braking force corresponding to the magnitude to stop normal creep torque is generated from the brake to stop the vehicle, if the speed is close to zero, creep torque is generated and, in this case, too, the braking force exceeding the normal creep generated from the brake, and thus a test motor torque command value corresponding to the creep torque is added to the output of the second braking force computation unit 502.

The braking force comparison unit receives the first braking force candidate from the first braking force computation unit 501, and receives the second braking force candidate from the addition unit 503 to determine a smaller one of the first braking force candidate and the second braking force candidate as the braking force. The reason for making this determination is as follows. The braking force of a disc brake, etc, is generated by friction, and the magnitude of the braking force is determined by the combination of the force to press the disc and the rotation speed of a wheel.

The relationship between the braking force and the brake pedal operation signal referred to by the first braking force computation unit 501 will, be described below with reference to FIG. 6.

Figure 6:
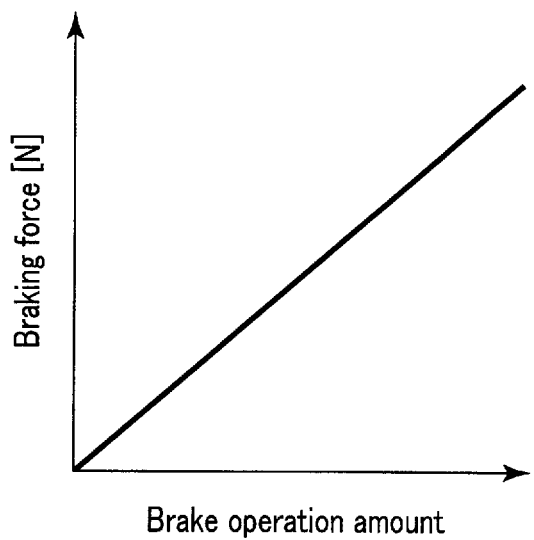
FIG. 6 is a graph showing the relationship between a brake pedal operation signal and braking force.

In the graph shown in FIG. 6, the horizontal axis indicates the amount of the brake pedal which is represented by the brake pedal operation signal, and the vertical axis indicates the braking force. As shown in FIG. 6, the braking force increases in proportion to the increase of the operation amount of the brake pedal and thus the braking force can be determined if the operation amount of the brake pedal is known.

The relationship between the braking force and the vehicle speed referred to by the second braking force computation unit 502 will be described below with reference to FIG. 7.

Figure 7:
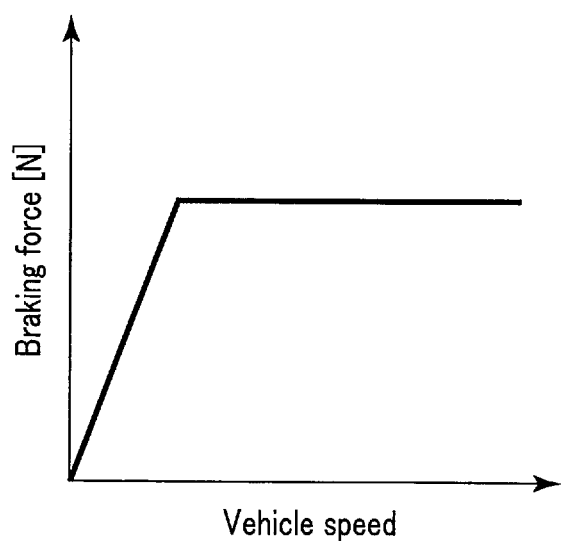
FIG. 7 is a graph showing the relationship between vehicle speed and braking force.

In the graph shown in FIG. 7, the horizontal axis indicates vehicle speed, and the vertical axis indicates the braking force. The braking force can be determined if the vehicle speed is known by referring to the relationship as shown in FIG. 7.

According to the first embodiment described above, the evaluation test can be more easily conducted for the actual ECU on a chassis without incorporating the ECU into the actual vehicle by computing the braking force and the driver signal that includes the accelerator operation signal and the brake operation signal in consideration of the running resistance corresponding to the test conditions, and by controlling the torque of the test motor to be tested using the driver signal and the braking force and the load motor coupled to the test motor.

(Second Embodiment)

The first embodiment presupposes a case where a test condition is set in advance. The second embodiment differs from the first embodiment in that a test condition is input and a test result is output.

An electric-vehicle testing system according to the second embodiment will be described with reference to FIG. 8.

Figure 8:
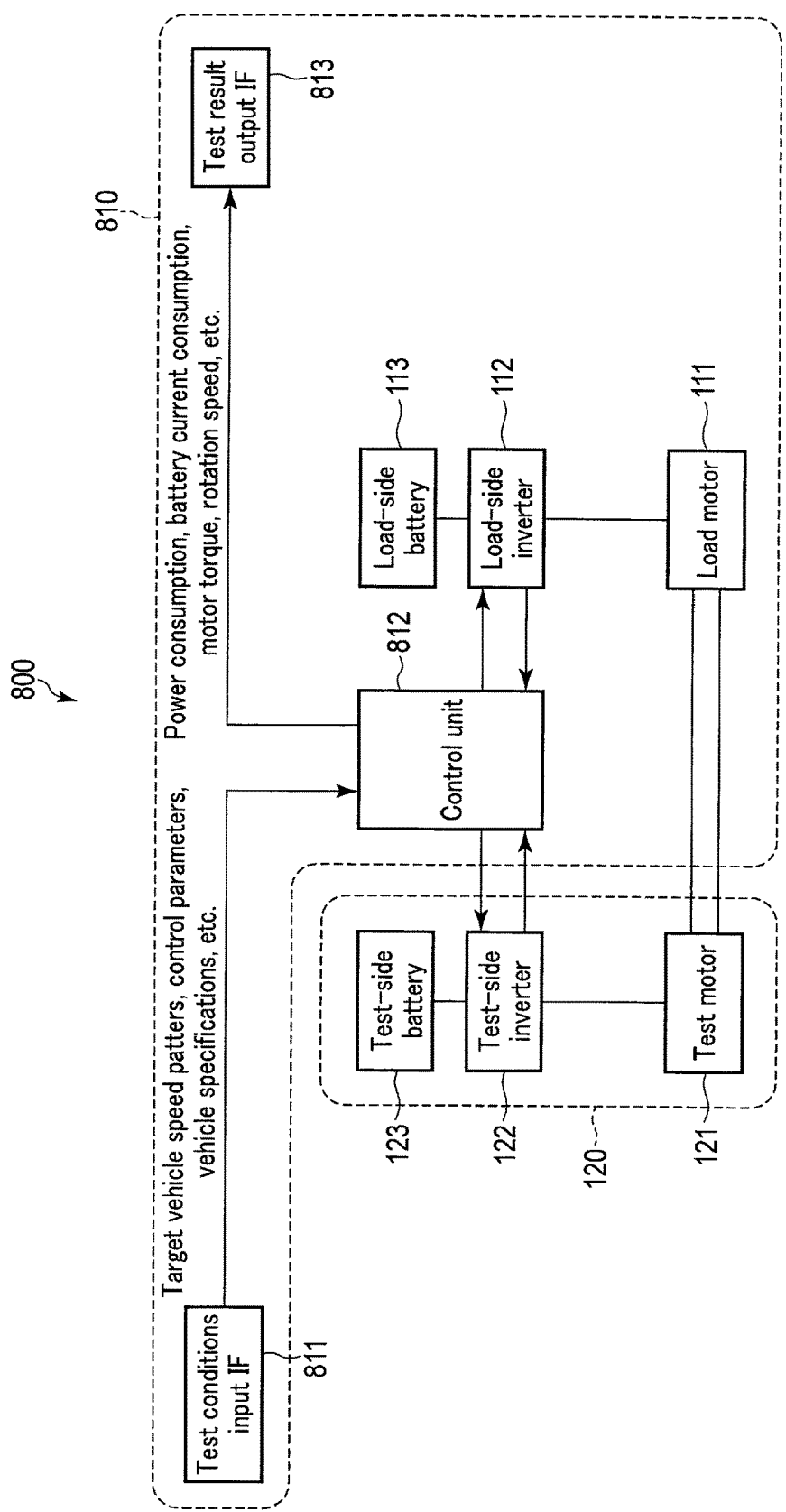
FIG. 8 is a block diagram showing an electric-vehicle testing system according to a second embodiment.

The electric-vehicle testing system 800 shown in FIG. 8 includes an electric-vehicle testing device 810 and a test object 120. The electric-vehicle testing device 810 includes a load motor 111, a load-side inverter 112, a load-side battery 113, a test conditions input interface 811 (also referred to as a test conditions input IF or an input section hereinafter), a control unit 812, and a test result output interface 813 (also referred to as a test result output IF or an output section hereinafter).

The test object 120, load motor 111, load-side inverter 112, and load-side battery 113 perform the same operations as those in the first embodiment and thus their descriptions will be omitted.

The test conditions input IF 811 inputs the test conditions (target vehicle speed patterns, control algorithms of the motor control ECU, control parameters of the actual ECU, vehicle specifications of an assumed vehicle, etc.) to the control unit 812. Test conditions to be input are not limited to these elements. The test conditions include, for example, a road inclination that is not included in the vehicle specifications. Furthermore, if tests are conducted for a plurality of target vehicle speed patterns and a plurality of control parameters, a test result can be obtained based on each of the target vehicle speed patterns and each of the control parameters.

The control unit 812 receives the test conditions from the test conditions input IF 311 to control the test motor 121 and the load motor through the test-side inverter 122 and the load-side inverter 112 on the basis of the test conditions, as in the first embodiment.

The test result output IF 812 receives test result data that is a result of a test conducted based on the test conditions input from the control unit 12, and outputs to a display or the like a test result obtained by summarizing the test result data using a GUI, etc.

The control unit 812 according to the second embodiment will be described in detail below with reference to FIG. 2.

Figure 2:
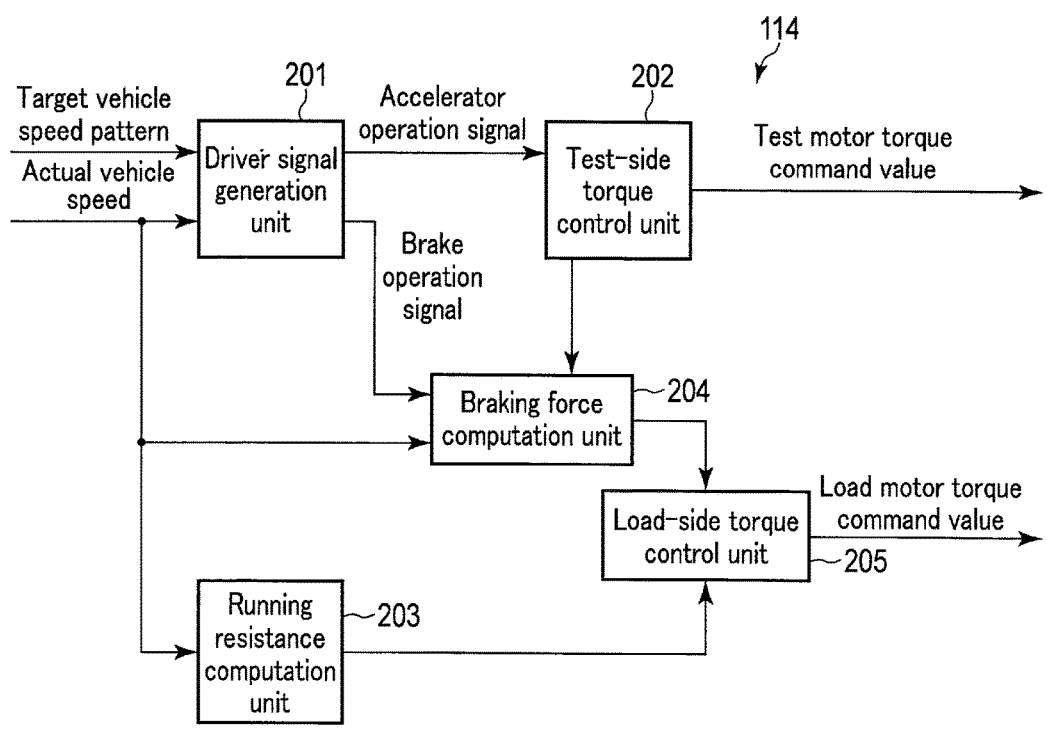
FIG. 2 is a block diagram showing the details of a control unit according to the first embodiment.
Figures 9, 10:
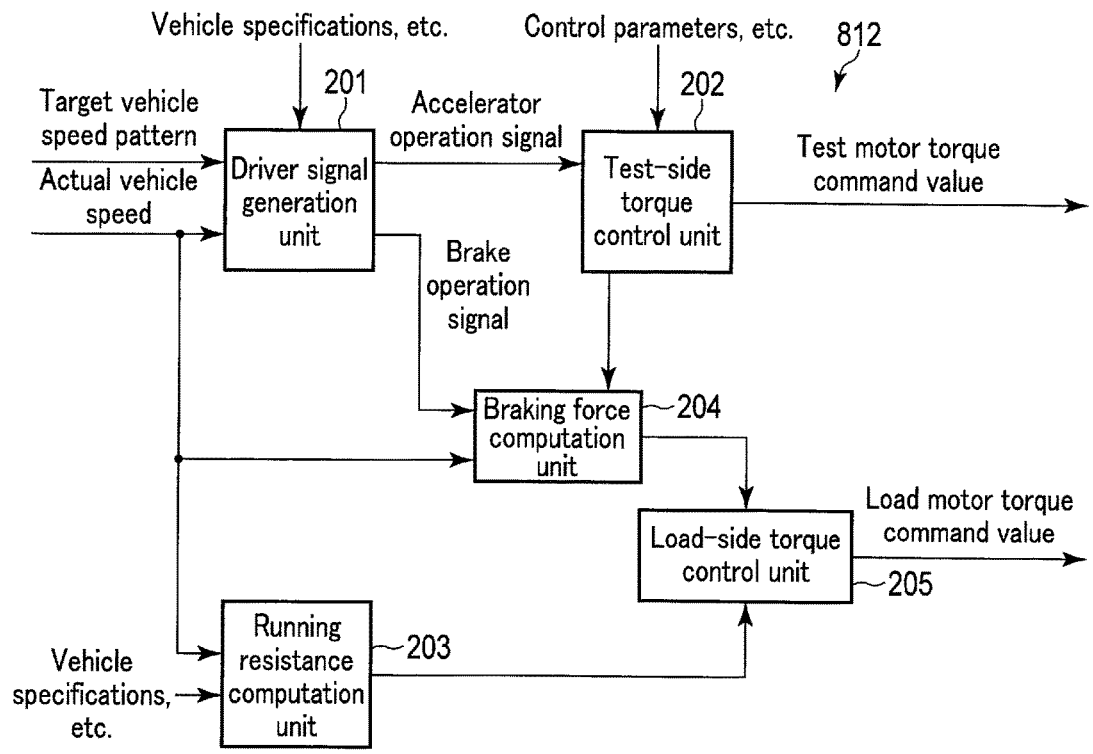
FIG. 9 is a block diagram showing the details of a control unit according to the second embodiment.
FIG. 10 is a diagram showing an example of test results output from a test result output IF.

Though the control unit shown in FIG. 9 performs substantially the same operation as the control unit 114 shown in FIG. 2, it differs therefrom in using the test conditions input to the test conditions input IF 811 as test conditions. Specifically, when the target acceleration and the running resistance are computed, the driver signal generation unit 201 uses the target vehicle speed pattern and vehicle specifications input to the test conditions input IF 811. Similarly, the running resistance computation unit 203 computes running resistance using the vehicle specifications put to the test conditions input IF 811, and the test-side torque control unit 202 generates a test motor torque command value using the control parameters and control algorithms of the motor control ECU, which are input to the test conditions input IF 311.

An example of a test result output from the test result output IF 813 will be described below with reference to FIG. 10.

FIG. 10 shows an example of result items output to a display, wherein a battery total output 1001, a total running distance 1002, and a power consumption rate 1003 are shown.

The battery total output 1001 (unit: kWh) is computed by integrating a value obtained by multiplying a DC current and a DC voltage detected by the test-side inverter 122.

The total running distance 1002 (unit: km) is computed by integrating the actual vehicle speed in the control unit 812.

The power consumption rate 1003 (unit: km/kWh) is a value computed by dividing the total running distance 1002 by the battery total output 1001. The power system including the actual ECU can be evaluated by conducting an evaluation test along the test conditions as shown in FIG. 10.

In addition, an example of another evaluation item of the test results will be described with reference to FIG. 8, 11 to 15.

FIG. 11 is a graph showing the comparison of time-series data of the target vehicle speed (target vehicle speed pattern) and the actual vehicle speed. The horizontal axis indicates elapsed time and the vertical axis indicates the vehicle speed. As the target vehicle speed and the actual vehicle speed, a value obtained from the driver signal generation unit 201 can be used.

FIG. 12 shows time-series data of the test motor output torque. The horizontal axis indicates elapsed time and the vertical axis indicates the test motor output torque. The test motor output torque computed from the motor driving current computed by a current sensor provided in the test-side inverter 122. The test motor output torque can be computed from the motor driving current by the control unit 812, computed by a torque computation unit not shown), or transferred to the control unit 812.

Figure 13:
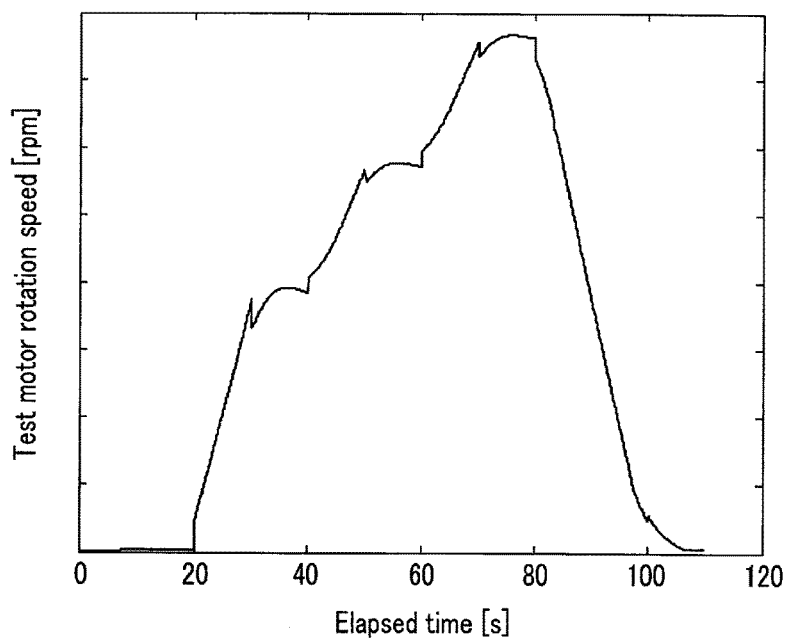
FIG. 13 is a graph showing time-series data of test motor rotation speed.

FIG. 13 shows time-series data of test motor rotation speed. The horizontal axis indicates elapsed time and the vertical axis indicates the test motor rotation speed. As the test motor rotation speed, a value detected by the foregoing rotation speed detecting element can be used.

Figure 14:
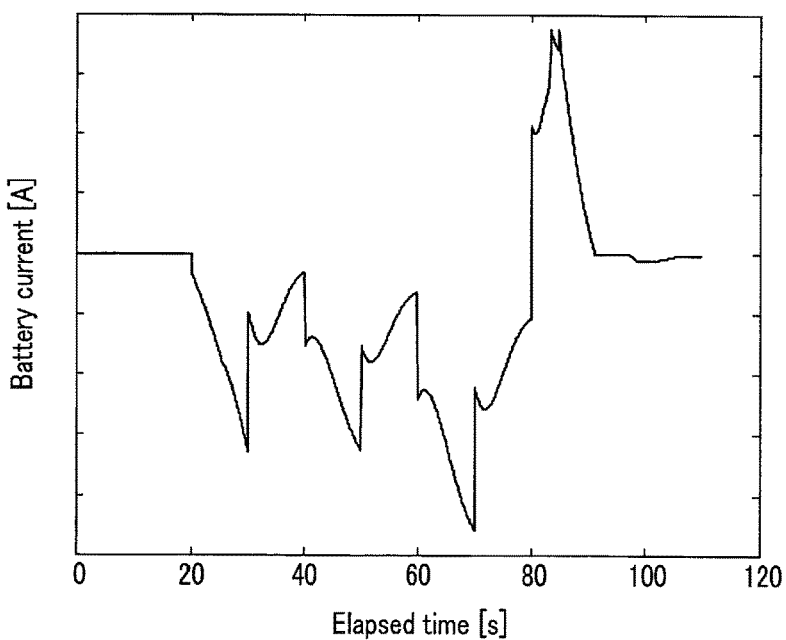
FIG. 14 is a graph showing time-series data of battery current of a test-side battery.

FIG. 14 shows time-series data of battery current of the test-side battery 123. The horizontal axis indicates elapsed time and the vertical axis indicates the battery current. The battery current is computed by a current sensor provided in the test-side battery 123.

Figure 15:
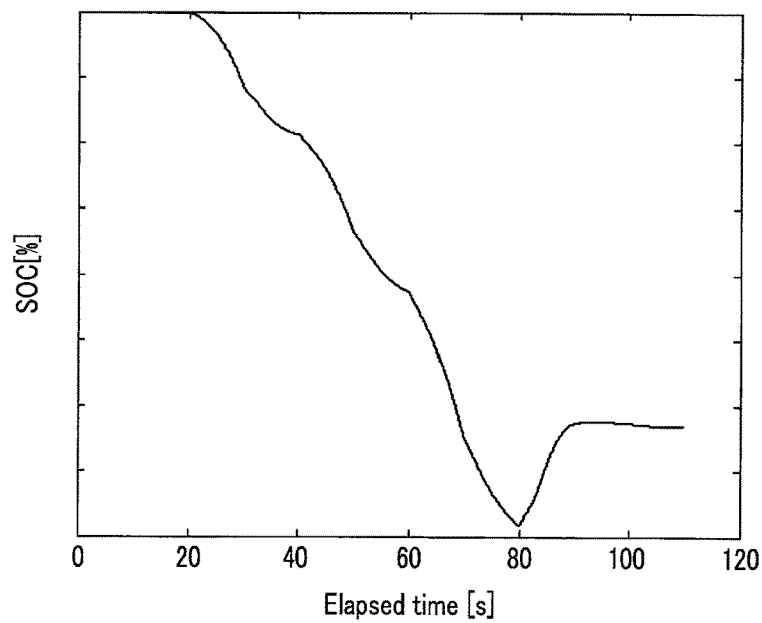
FIG. 15 is a graph showing time-series data of battery state of charge of the test-side battery.

FIG. 15 shows time-series data of a battery state of charge (SOC) of the test-side battery 123. The horizontal axis indicates elapsed time and the vertical axis indicates the SOC. The SOC is computed by the sensor provided in the test-side battery 123 (e.g., a battery management unit be described in a third embodiment).

Figure 16:
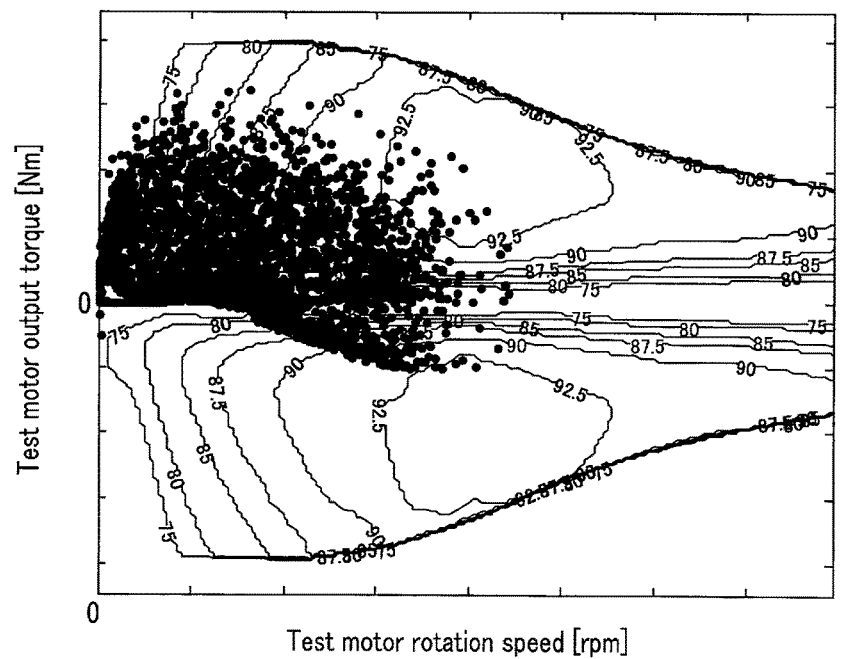
FIG. 16 is a chart showing the occurrence frequency of the test motor rotation speed and the output torque.

FIG. 16 is a chart plotting sampling points of the rotation speed of the test motor 121 and the corresponding output torque thereof at the time of running in the target vehicle speed pattern.

The horizontal axis indicates the test motor rotation speed, and the vertical axis indicates the test motor output torque. The occurrence frequency regarding the efficiency of the test motor can be expressed by plotting the occurrence frequency on a chart representing the efficiency, which is obtained from the relationship between the torque and the rotation speed of a motor that is measured in advance, by isolines and the like as shown in FIG. 16. It is thus possible to evaluate whether the test motor 121 is used with efficient torque and rotation seed under the test conditions. If the sampling points are gathered in a high-efficiency region indicated by isolines, the motor can be used under the conditions of high efficiency and small losses and, in other words, it can be said that power consumption can be on at the time of running.

When a plurality of elements are input to the test condition input IF as test conditions such as a plurality of target vehicle speed patterns, a plurality of control algorithms, and a plurality of control parameters, the tests can be conducted in sequence in the specified combinations of the test conditions. After the tests are conducted in sequence, the test result output IF 813 outputs a test result for each of the combinations. The test result output IF 813 may output test results for each of the combinations as a list.

According to the second embodiment described above, the influence of the vehicle specifications and the control algorithms of the motor control ECU on the actual electricity costs can be evaluated on the chassis without being incorporated into the actual vehicle. The motor efficiency can easily be determined under various test conditions by graphing the occurrence frequency regarding the motor efficiency.

(Third Embodiment)

The third embodiment differs from the foregoing embodiments in that it includes a battery management unit (EMU) to control a battery.

Figure 17:
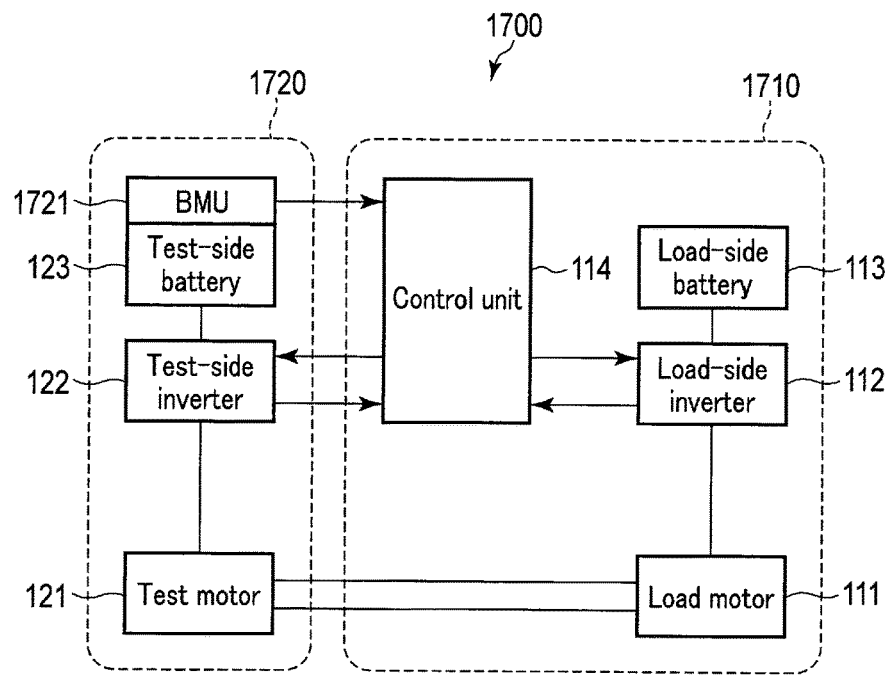
FIG. 17 is a block diagram showing an electric-vehicle testing system according to a third embodiment.

An electric-vehicle testing system including an electric-vehicle testing device according to the third embodiment will be described with reference to FIG. 17.

The electric-vehicle testing system 1700 according to the third embodiment includes an electric-vehicle testing device 1710 and a test object 1720. The electric-vehicle testing device 1710 includes a load motor 111, a load-side inverter 112, a load-side battery 113, and a control unit 114. The test object 1720 includes a test motor 121, a test-side inverter 122, a test-side battery 123, and a EMU 1721.

The test motor 121, test-side inverter 122, test-side battery 123, load motor 111, load-side inverter 112, and load-side battery 113 perform the same operations as those in the first embodiment and thus their descriptions will be omitted.

The BMU 1721 controls the test-side battery 123 to generate a battery output current and a state signal including an SOC and the like.

The control unit 114 has the same configuration as shown in FIG. 2, but it allows evaluation even though the test-side torque control unit. 202 includes motor control algorithms corresponding to the state of a battery. For example, the test-side torque control unit 202 computes a test motor torque command value using the state signal, and the test result output. IF 813 outputs a test result based on the state signal.

Since information such as the battery output current and SOC, which is used to display the output results as shown in FIGS. 10, 14, and 15, can be acquired from the BMU, power consumption can be accurate determined. In the third embodiment, the battery total output shown in FIG. 10 can be determined from power consumption computed by integrating a value obtained by multiplying the battery current and voltage acquired from the BMU.

According to the third embodiment described above, the use of the BMU makes it possible to compute power consumption more accurately and enhance the accuracy of evaluation.

(Fourth Embodiment)

The fourth embodiment differs from the foregoing embodiments in that a torque detection unit is connected to the load motor and the test motor.

Figure 18:
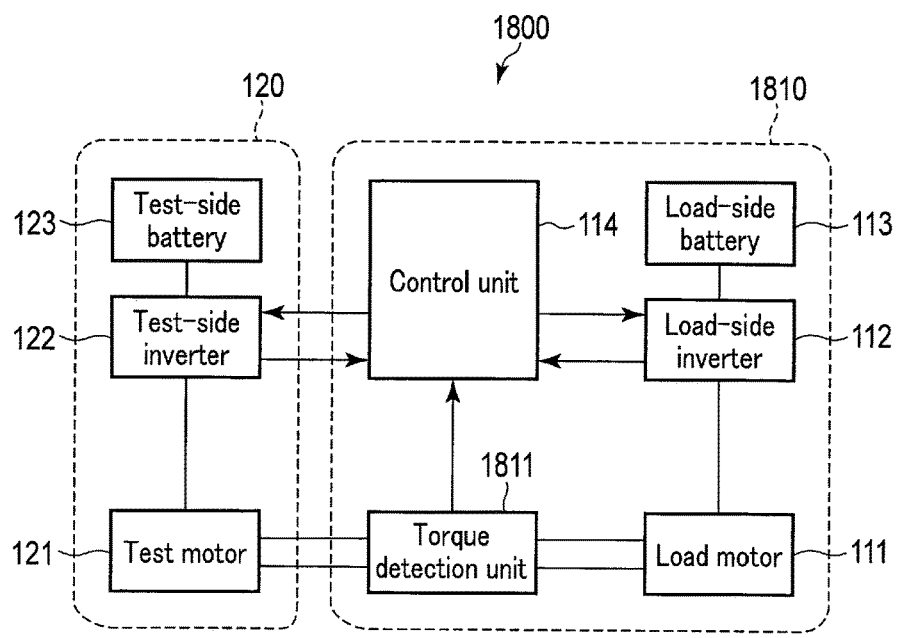
FIG. 18 is a block diagram showing an electric-vehicle testing system according to a fourth embodiment.

An electric-vehicle testing system including an electric-vehicle testing device according to the fourth embodiment will be described with reference to FIG. 18.

The electric-vehicle testing system 1800 according to the fourth embodiment includes an electric-vehicle testing device 1810 and a test object 120.

The electric-vehicle testing device 1810 includes a load motor 111, a load-side inverter 112, a load-side battery 113, a control unit 114, and a torque detection unit 1811.

The test object 120, load motor 111, load-side inverter 112, and load-side battery 113 perform the same operations as those in the first embodiment and thus their descriptions will be omitted.

The torque detection unit 1811 is disposed on an axis formed by coupling the output shafts of the test motor 121 and the load motor 111 to each other to detect output torque of each of the test motor 121 and load motor 111 and thus compute a torque value.

The control unit 114 computes the torque value from 1C the torque detection unit 1811.

According to the fourth embodiment described above, the output torque can be computed more accurately and the evaluation can be made more precisely than in a method for converting the motor output torque from the inverter output current.

The instructions provided in the processing procedure in the foregoing embodiments can be executed based on programs that are software. A general-purpose computer system stores the programs in advance and then reads the programs to make it possible to obtain an advantage similar to the advantage of the above-described electric-vehicle testing device. The instructions described in the foregoing embodiments are recorded, as computer-executable programs, magnetic disk (flexible disk, hard disk, etc.), an optical disk (CD-ROM, CD-R, CD-RW, DVD-ROM, DVD±R, DVD±RW, Blu-ray (registered trademark) discs, etc.), a semiconductor memory, or a recording medium similar thereto. If a computer or an embedded system is a readable recording medium, it may have any storage format, if the computer reads a program from the recording medium and causes a CPU to execute an instruction described in the program on the basis of the program, an operation similar to that of the electric-vehicle testing device of the above-described embodiments can be performed. Of course, the computer may acquire or read the program via the network.

Furthermore, based on instructions of programs installed in the computer and embedded system on a recording medium, database management software, middleware (MW) such as a network, or the like, some of the processes to attain the present embodiment can be performed by an operating system (OS) running on a computer.

Furthermore, the recording medium of the present embodiment is not limited to a medium independent of a computer or an embedded system, but includes a recording medium that stores or temporarily stores programs downloaded and transmitted via a LAN, the Internet, or the like.

Moreover, the number of recording mediums is not limited to one, if the process in the present embodiment is performed from a plurality of mediums, the mediums are included in the recording medium of the present embodiment, and the mediums may have any configuration.

The computer or the embedded system in the present embodiment is designed to perform each of the processes of the present embodiment based on programs stored in a recording medium, and may have any configuration of, for example, a system to which a device of one of a personal computer, a microcomputer, etc., and a plurality of devices are connected through a network.

Moreover, the computer of the present embodiment is not limited to a personal computer, but also includes an as processing unit included in an information processing device, processing circuitry, a microcomputer, etc., and is a generic term of equipment and a device capable of fulfilling the functions of the present embodiment by programs.

While certain embodiments have been described, these embodiments have been presented by way of example only, and are not intended to limit the scope of the inventions. Indeed, the novel embodiments described herein may be embodied in a variety of other forms, furthermore, various omissions, substitutions, and changes in the form of the embodiments described herein may be made without departing from the spirit of the inventions. The accompanying claims and their equivalents are intended to cover such forms or modifications as would fall within the scope and spirit of the inventions.

What is claimed is:

1. An electric-vehicle testing apparatus comprising:
processing circuitry configured to:
generate a first signal corresponding to accelerator operation amount by a driver and a second signal corresponding to brake operation amount by the driver in accordance with test conditions that include a target vehicle speed pattern indicating a variation in target vehicle speed along a time series;
control torque of a test motor included in a test object based on a first command value corresponding to the first signal;
compute running resistance to be assumed when a vehicle runs using a rotation speed of the test motor;
compute braking force using the second signal and an actual vehicle speed obtained from the rotation speed of the test motor; and
control torque of a load motor coupled to the test motor, based on a second command value corresponding to the running resistance and the braking force,
wherein the processing circuitry determines, as the braking force, a smaller one of a first braking force candidate corresponding to the second signal and a sum of a second braking force candidate corresponding to the actual vehicle speed and a first command value corresponding to creep torque of the vehicle.

2. The apparatus according to claim 1, further comprising:
a load motor having an output shaft;
a load-side inverter which controls rotation of the load motor in accordance with the second command value: and
a load-side battery which applies power to the inverter,
wherein the test motor has an output shaft, the test object further includes a test-side inverter that controls rotation of the test motor in accordance with the first command value and a test-side battery which applies power to the test-side inverter, and
the output shaft of the load motor and the output shaft of the test motor are coupled.

3. The apparatus according to claim 1, wherein the processing circuitry stores control algorithms used in an actual engine control unit (ECU).

4. The apparatus according to claim 1, wherein the processing circuitry is further configured to output a test result of a test conducted under the test conditions.

5. The apparatus according to claim 1, wherein the processing circuitry is further configured to input at least one of the target vehicle speed pattern, control algorithms used in an actual engine control unit (ECU), control parameters, and vehicle specifications as the test conditions.

6. The apparatus according to claim 5, wherein the processing circuitry outputs a result obtained by plotting sampling points on isolines representing efficiency of the test motor, the sampling points relating to the rotation speed of the test motor along a time series of the target vehicle's speed pattern and corresponding output torque of the test motor.

7. The apparatus according to claim 5, wherein when the test object includes a test-side inverter to control rotation of the test motor in accordance with the first command value, a test-side battery to apply power to the test-side inverter, and a battery management unit to generate a state signal indicating a state of the test-side battery, the processing circuitry computes the first command value using the state signal.

8. The apparatus according to claim 1, wherein the processing circuitry is further configured to detect output torque of each of the test motor and the load motor.

9. The apparatus according to claim 5, wherein when the test conditions are input to the processing circuitry, tests are conducted in sequence in specified combinations of the test conditions.

10. The apparatus according to claim 9, wherein the processing circuitry outputs a test result for each of the combinations.

11. The apparatus according to claim 1, further comprising:
a load-side inverter which controls rotation of the load motor in accordance with the second command value;
a load-side battery which applies power to the inverter,
wherein the test object includes
a test-side inverter that controls rotation of the test motor in accordance with the first command value, and
a test-side battery which applies power to the test-side inverter.

12. An electric-vehicle testing method comprising:
generating a first signal corresponding to accelerator operation amount by a driver and a second signal corresponding to brake operation amount by the driver in accordance with test conditions that include a target vehicle speed pattern indicating a variation in target vehicle speed along time series;
controlling torque of a test motor included in a test object based on a first command value corresponding to the first signal;
computing running resistance to be assumed when a vehicle runs using a rotation speed of the test motor;
computing braking force using the second signal and an actual vehicle speed obtained from the rotation speed of the test motor; and
controlling torque of a load motor coupled to the test motor, based on a second command value corresponding to the running resistance and the braking force, wherein the computing the braking force determines, as the braking force, a smaller one of a first braking force candidate corresponding to the second signal and a sum of a second braking force candidate corresponding to the actual, vehicle speed and a first command value corresponding to creep torque of the vehicle.

13. The method according to claim 12, further comprising storing, in a storage, control algorithms used in an actual engine control unit (ECU).

14. The method according to claim 12, wherein further comprising outputting a test result of a test conducted under the test conditions.

15. The method according to claim 12, further comprising inputting at least one of the target vehicle speed pattern, control algorithms used in an actual engine control unit (ECU), control parameters, and vehicle specifications as the test conditions.

16. The method according to claim 15, further comprising outputting a result obtained by plotting sampling points on isolines representing efficiency of the test motor, the sampling points relating to the rotation speed of the test motor along a time series of the target vehicle's speed pattern and corresponding output torque of the test motor.

17. The method according to claim 15, further comprising computing the first command value using the state signal when the test object includes a test-side inverter to control rotation of the test motor in accordance with the first command value, a test-side battery to apply power to the test-side inverter, and a battery management unit to generate a state signal indicating a state of the test-side battery.

18. The method according to claim 12, further comprising detecting output torque of each of the test motor and the load motor.

* * * * *